3,169,859
Patented Feb. 16, 1965

3,169,859

SUPERCONDUCTIVE MATERIALS

Harry N. Treaftis, Lee, Charles E. Watts, Jr., Pittsfield, and Raymond A. Meyer, Richmond, Mass., assignors to General Electric Company, a corporation of New York No Drawing. Filed Mar. 27, 1962, Ser. No. 182,926
6 Claims. (Cl. 75—134)

This invention relates to superconductive devices and more particularly it relates to superconductive materials which are useful in connecting superconductive devices and circuit elements and as superconductive elements in and of themselves.

The use of superconductive circuits and devices using such circuits which exhibit at low temperatures approaching 0° K. no electrical resistance is well known. Among such devices and equipment in which they are used are cryotrons, computers, IR sensors, cryogenic gyroscopes, magnetic shielding films, and the like. Such superconductive materials are often used in highly miniaturized form employing fine wires or very thin films which are very delicate and subject to destruction by the application of physical force or heat. These characteristics produce a problem when the elements of such devices are to be joined or connected one to the other. While solders are a logical means for joining superconductive elements, the use of ordinary heat-melted solders generally destroys or damages the delicate superconductive elements themselves. From the above it will be quite evident that there is a need for easy and convenient means for joining superconductive elements which can be applied without destroying the elements which will be compatible with the size of the elements themselves and which are themselves superconductive.

It is therefore a principal object of this invention to provide improved means for joining together superconductive elements.

Another object is to provide new superconductive materials.

Briefly, the invention relates to superconductive materials comprising gallium and indium-tin alloy which can be used as a cold solder or room temperature solder for joining together superconductive elements or as such elements themselves.

Also useful in connection with the present invention are materials consisting of amalgams or mixtures of gallium and indium and gallium and tin.

Those features of the invention which are believed to be novel are set forth in the claims appended hereto. The invention will, however, be better understood and further advantages and uses appreciated from a consideration of the following description:

The alloys of the invention comprise by weight broadly up to about 80 percent of a 50 percent indium–50 percent tin alloy with the remainder gallium. The preferable composition range for the alloy is from 95 percent to 80 percent gallium and from 5 percent to 20 percent of a 50 percent indium–50 percent tin alloy. A specific preferred alloy consists of about 95 percent gallium and 5 percent of a 50 percent indium–50 percent tin alloy, this alloy having a critical temperature of about 6.2° K.

As pointed out above, it has been found that gallium-indium materials are also useful in the present connection. For example, a mixture of by weight 80 percent gallium and 20 percent indium has a critical temperature of 4.16° K. which, while somewhat lower than those above, is still quite useful for some purposes. Likewise, a mixture of 60 percent gallium and 40 percent indium has been found to have a like critical temperature of 4.16° K. Similary, it has been found that mixtures of gallium and tin are useful. For example, a mixture of one-third gallium and two-thirds tin has a critical temperature of about 4.2° K.

The present superconductive materials can be made in any convenient manner as, for example, by alloying, amalgamating, mixing or dissolving the indium, tin or indium-tin alloy in the liquid gallium at room temperature.

The following examples will illustrate the practice of the invention, it being realized that they are exemplary only and that the proportions shown may be departed from to some extent without detracting from the benefits accruing to the invention.

*Example 1*

There were mixed together 5 percent of the above indium-tin alloy and 95 percent gallium to produce a material having a critical temperature of 6.2° K.

*Example 2*

Example 1 was repeated using 90 percent gallium and 10 percent of the indium-tin alloy to produce a material having a critical temperature of 6.0° K.

*Example 3*

Example 1 was repeated using 80 percent gallium and 20 percent of the indium-tin material. This amalgam had a critical temperature of 5.4° K.

*Example 4*

Example 1 was repeated using a fifty-fifty mixture of gallium and the indium-tin alloy, the resultant amalgam having a critical temperature of 5.6° K.

*Example 5*

Example 1 was repeated using 78 percent of the indium-tin alloy and 22 percent gallium, the resultant amalgam having a critical temperature of 5.6° K.

If in the above about 78 to 80 percent of the indium-tin alloy is used, it is necessary to heat the gallium-indium tin alloy mixture in order to intermix the two. This, of course, detracts from the usefulness of the invention since the amalgam returns to a solid state at room temperature and would have to be reheated in order to serve its function as a solder.

*Example 6*

There were mixed together 80 percent of gallium and 20 percent of indium to produce an amalgam having a critical temperature of 4.16° K.

*Example 7*

Example 6 was repeated using 60 percent gallium and 40 percent indium, the resultant material again having a critical temperature of 4.16° K.

*Example 8*

There were mixed together, again at room temperature, gallium and tin in the proportions of one-third to two-thirds, respectively, to produce an amalgam having a critical temperature of 4.2° K.

In joining together fine superconductive wires or films, the present cold solder is simply brushed on or applied to the joint in any convenient manner at room temperature without the application of external heat, the mixture being in the nature of a semi-fluid at such temperature. At lower temperatures, at which cryogenic devices operate, the solder becomes rigid and solid but upon return to room temperature once again becomes plastic or semi-fluid so that the elements may be disconnected and replaced very readily.

There are provided, then, by the present invention superconductive materials which can be used as room temperature solders to connect very delicate superconductive elements by merely applying the material to the elements to be joined without danger of damage which would be attendant to the use of ordinary heat-melted solders. They can also be used as superconductive elements in and of themselves simply by coating the material in any convenient way on a suitable base. Thus, they can be used as transmission lines, printed circuits and the like.

What we claim as new and desire to secure by Letters Patent of the United States is:

1. An electrical device containing superconductive elements joined together by a room temperature solder consisting essentially of by weight 95% gallium and 5% of a 50% by weight indium–50% by weight tin alloy.

2. An electrical device containing superconductive elements joined together by a room temperature solder consisting essentially of by weight from about 80 to 60% gallium and 20 to 40% indium.

3. An electrical device containing a superconductive element consisting essentially of by weight 95% gallium and 5% of a 50% indium–50% tin alloy.

4. An electrical device containing a superconductive element, said element consisting essentially of by weight 80 to 60% gallium and 20 to 40% indium.

5. An electrical device containing superconductive elements joined together by a room temperature solder, said solder being selected from the group consisting of gallium and a material selected from the group consisting of (*a*) indium and (*b*) a 50% by weight indium–50% by weight tin alloy, the amount of indium in (*a*) above ranging from about 20 to 40% by weight and the indium-tin alloy in (*b*) ranging from about 5% to about 80% by weight, the remainder in each case being gallium.

6. An electrical device containing a superconductive element, said element consisting essentially of a material selected from the group consisting of gallium and a material selected from the group consisting of (*a*) indium and (*b*) a 50% by weight indium–50% by weight tin alloy, the amount of indium in (*a*) above ranging from about 20 to 40% by weight and the indium-tin alloy in (*b*) ranging from about 5% to about 80% by weight, the remainder in each case being gallium.

References Cited by the Examiner

UNITED STATES PATENTS 3,023,393 2/62 Oliver ---------------- 75—134 X

OTHER REFERENCES

Materials and Methods, vol. 36, September 1952, pages 113–115.

Paper from "1957 Fourth National Symposium on Vacuum Technology Transactions" Pergammon Press, New York, 1958, pages 38–41.

"Physical Chem. of Ga-In Alloys. Final Technical Report" NR052109, June 1950, Office of Naval Research Contract.

DAVID L. RECK, *Primary Examiner.*

WINSTON A. DOUGLAS, *Examiner.*